(12) United States Patent
Chen

(10) Patent No.: US 9,240,399 B2
(45) Date of Patent: Jan. 19, 2016

(54) ACTIVE DEVICE ARRAY SUBSTRATE AND REPAIRING METHOD THEREOF

(71) Applicant: Au Optronics Corporation, Hsinchu (TW)

(72) Inventor: Ping-Lin Chen, Kaohsiung (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 14/339,468

(22) Filed: Jul. 24, 2014

(65) Prior Publication Data

US 2015/0325564 A1    Nov. 12, 2015

(30) Foreign Application Priority Data

May 8, 2014  (TW) .............................. 103116408 A

(51) Int. Cl.
| | |
|---|---|
| H01L 21/70 | (2006.01) |
| H01L 23/58 | (2006.01) |
| H01L 27/14 | (2006.01) |
| H01L 29/66 | (2006.01) |
| H01L 27/02 | (2006.01) |
| H01L 27/12 | (2006.01) |

(52) U.S. Cl.
CPC .......... *H01L 27/0207* (2013.01); *H01L 27/124* (2013.01); *H01L 27/1259* (2013.01)

(58) Field of Classification Search
CPC .................................................. H01L 27/1214

USPC ................ 257/390, 48, E21.411, 72, 192, 59, 257/E27.111; 438/17, 158, 14, 697; 345/99, 345/55; 327/541

See application file for complete search history.

(56) References Cited

U.S. PATENT DOCUMENTS

| | | | | |
|---|---|---|---|---|
| 6,828,817 | B2 * | 12/2004 | Fujita ......................... | 324/750.3 |
| 7,724,019 | B2 | 5/2010 | Chang et al. | |
| 2006/0103410 | A1 * | 5/2006 | Jeon .............................. | 324/770 |
| 2008/0165110 | A1 | 7/2008 | Kim et al. | |
| 2011/0006780 | A1 * | 1/2011 | Tanimoto et al. ............. | 324/538 |
| 2011/0267572 | A1 * | 11/2011 | Chen et al. .................... | 349/143 |
| 2012/0147069 | A1 * | 6/2012 | Chen et al. .................... | 345/691 |

\* cited by examiner

*Primary Examiner* — Long K Tran
*Assistant Examiner* — Dzung Tran
(74) *Attorney, Agent, or Firm* — Jianq Chyun IP Office

(57) ABSTRACT

An active device array substrate includes a substrate, a first gate driving circuit, a second gate driving circuit, active devices, scan line structures and data lines. The substrate has an active region, a first peripheral region and a second peripheral region. The first and the second gate driving circuits are respectively located at the first and the second peripheral regions. Active device are arranged in an array at the active region. Each scan line structure includes a first scan line, a second scan line and an auxiliary pattern. The first scan line having a first terminal end and the second scan line having a second end are connected to a same row of the active devices respectively. A gap is between the first terminal end and the second terminal end. The auxiliary pattern is disposed on the gap and overlaps the first terminal end and the second terminal end.

17 Claims, 6 Drawing Sheets

ACTIVE DEVICE ARRAY SUBSTRATE AND REPAIRING METHOD THEREOF

CROSS-REFERENCE TO RELATED APPLICATION

This application claims the priority benefit of Taiwan application serial no. 103116408, filed on May 8, 2014. The entirety of the above-mentioned patent application is hereby incorporated by reference herein and made a part of this specification.

BACKGROUND OF THE INVENTION

1. Field of the Invention

The invention relates to an array substrate and a repairing method thereof, and more particularly, to an active device array substrate and a repairing method thereof.

2. Description of Related Art

In recent years, with the gradual advancement of the flat panel display technology, the flat panel display products gain popularity in the market, and the vendors have been further developed the technologies for the flat panel displays toward miniaturization and low production cost. In order to lower the production costs of the flat panel displays, a technology to produce a multi-stage shift register directly on the substrate of the panel has been existed, so as to replace the conventional gate driver IC and thus to achieve the purpose of reducing the production costs of flat panel displays. In order to reduce the device size and reduce the resistance-capacitance delay (RC delay) phenomenon, a technology to simultaneously drive one scan line by two sets of the multi-stage shift registers which are disposed at the right and left sides of the substrate has also been existed, which is also known as the "bilateral synchronous driving circuit".

However, since in the bilateral synchronous driving circuit, the same scan line is driven by two sets of the multi-stage shift registers, the abnormal driving may occur to the whole scan line when either side of the driving circuit has defects. For example, when the pull-down circuit in the driving circuit of one side has defects, the voltage at both ends of one same scan line can not be simultaneously pulled down and the large voltage difference is generated. Accordingly, large current produced by such large voltage difference may be transmitted to the driving circuit, which damages the control board which provides signals, so that the panel can not be displayed normally. In general, the positions of the defects are unable to be determined in a short time to immediately repair the damage caused by the current return, such that those defective panels must be discarded. Accordingly, the production costs may be significantly increased.

SUMMARY OF THE INVENTION

The invention provides an active device array substrate, which can effectively prevent the control board which provides signals from damaging due to a large current return.

The invention provides a repairing method of the active device array substrate, which allows the repaired active device array substrate to have good driving effects.

The active device array substrate of the invention includes a substrate, a first gate driving circuit, a second gate driving circuit, active devices, scan line structures, and data lines. The substrate has an active region, a first peripheral region, and a second peripheral region. The active region is located between the first peripheral region and the second peripheral region. The first gate driving circuit is located at the first peripheral region. The second gate driving circuit is located at the second peripheral region. The active devices are arranged in an array at the active region. Each of the scan line structures includes a first scan line, a second scan line, and an auxiliary pattern. The first scan line is connected to a first part of the active devices of one of a row, and the first scan line has a first connecting end and a first terminal end. The first connecting end extends toward the first gate driving circuit. The second scan line is connected to a second part of the active devices of one of the row, and the second scan line has a second connecting end and a second terminal end. The second connecting end extends toward the second gate driving circuit. A gap is between the first terminal end and the second terminal end. The auxiliary pattern is disposed on the gap and overlaps the first terminal end and the second terminal end. The data lines are respectively connected to the active devices.

In an embodiment of the invention, the active region is divided into a central region and two outer regions which are located at two sides of the central region, and the gaps of the scan line structures are distributed in the central region.

In an embodiment of the invention, widths of the two outer regions are respectively substantially greater than or equal to one third of an overall width of the active region.

In an embodiment of the invention, a length of the first scan line and a length of the second scan line of each of the scan line structures are respectively substantially greater than or equal to one third of the overall width of the active region.

In an embodiment of the invention, a scanning time sequence of the first scan line of each of the scan line structures is the same as a scanning time sequence of the second scan line of the scan line structure.

In an embodiment of the invention, the first scan line of each of the scan line structures is driven by the first gate driving circuit, and the second scan line of each of the scan line structures is driven by the second gate driving circuit.

In an embodiment of the invention, the first scan line of at least one of the scan line structures is disconnected from the first gate driving circuit. The at least one scan line structure further includes connecting conductors, wherein the connecting conductors are connected between the first terminal end and the auxiliary pattern and connected between the second terminal end and the auxiliary pattern.

In an embodiment of the invention, the connecting conductors include weld joints.

In an embodiment of the invention, the first scan line and the second scan line of the at least one scan line structure are both driven by the second gate driving circuit.

In an embodiment of the invention, the first scan line of each of the scan line structures has a first main line portion and the second scan line of each of the scan line structures has a second main line portion. A linewidth of the first main line portion is greater than a linewidth of the first terminal end. A linewidth of the second main line portion is greater than a linewidth of the second terminal end. The first terminal end extends from the first main line portion toward the second main line portion. The second terminal end extends form the second main line portion toward the first main line portion.

In an embodiment of the invention, the gaps of the scan line structures are arranged along a straight line path.

In an embodiment of the invention, the first scan lines of the scan line structures have the same length, and the second scan lines of the scan line structures have the same length.

In an embodiment of the invention, the gaps of the scan line structures are arranged along a zigzag line path.

In an embodiment of the invention, the first scan lines of the scan line structures have at least two lengths, and the second scan lines of the scan line structures have at least two lengths.

The repairing method of the active device array substrate of the invention includes the following steps. An active device array substrate is provided. The active device array substrate includes: a substrate, a first gate driving circuit, a second gate driving circuit, active devices, scan line structures, and data lines. The substrate has an active region, a first peripheral region, and a second peripheral region, wherein the active region is located between the first peripheral region and the second peripheral region. The first gate driving circuit is located at the first peripheral region. The second gate driving circuit is located at the second peripheral region. The active devices are arranged in array at the active region. Each of the scan line structures includes a first scan line, a second scan line, and an auxiliary pattern. The first scan line is connected to a first part of the active devices of one of a row. The first scan line has a first connecting end and a first terminal end, wherein the first connecting end extends toward the first gate driving circuit. The second scan line is connected to a second part of the active devices of one of the row. The second scan line has a second connecting end and a second terminal end, wherein the second connecting end extends toward the second gate driving circuit. A gap is between the first terminal end and the second terminal end. The auxiliary pattern is disposed on the gap and overlaps the first terminal end and the second terminal end. The data lines are respectively connected to active devices. When a line defect on the active device array substrate occurs and the line defect corresponds to the first scan line of one of the scan line structures, the first scan line is disconnected from the first gate driving circuit, and connecting conductors are formed, wherein the connecting conductors connect between the first terminal end and the auxiliary pattern and connect between the second terminal end and the auxiliary pattern.

In an embodiment of the invention, a method of forming the connecting conductors includes a welding method.

In an embodiment of the invention, a method of disconnecting the first scan line from the first gate driving circuit includes laser cutting.

According to the above, the scan lines corresponding to the same row of the active device array substrate in the invention are separated from each other by a gap. Accordingly, the large current produced due to the large voltage difference at two ends of the same scan line, which damages the control board providing signals, can be effectively avoided. In addition, when the gate driving circuit which corresponds to one of the scan line structures of the active device array substrate has a defect, the panel can be effectively repaired by the repairing method of the active device array substrate in the invention, and the panel after being repaired can have good display effects.

In order to make the aforementioned and other features and advantages of the invention comprehensible, embodiments accompanied with figures are described in detail below.

DESCRIPTION OF EMBODIMENTS

Figure 1:
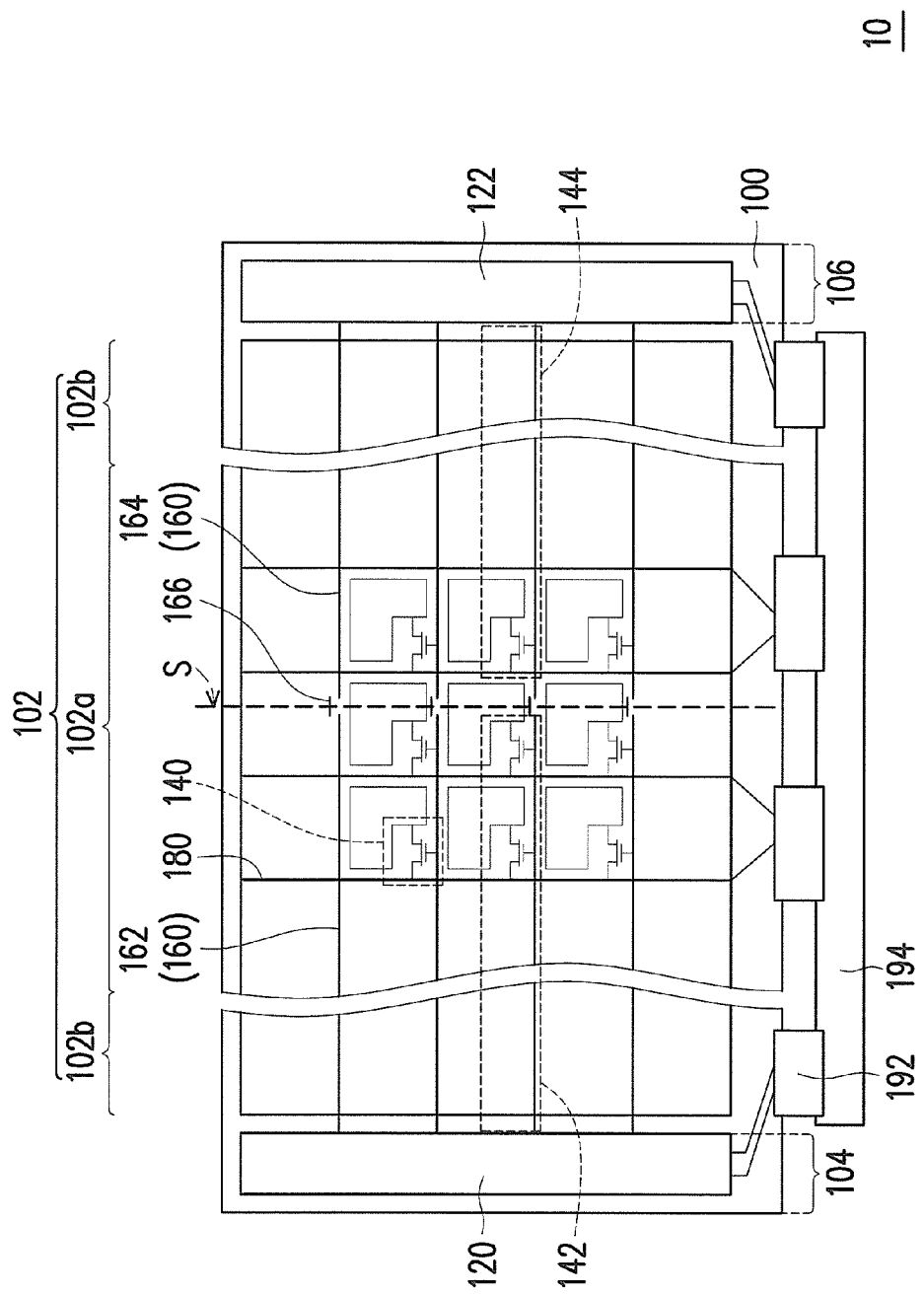
FIG. 1 illustrates a schematic diagram of an active device array substrate according to an embodiment of the invention.
Figure 2:
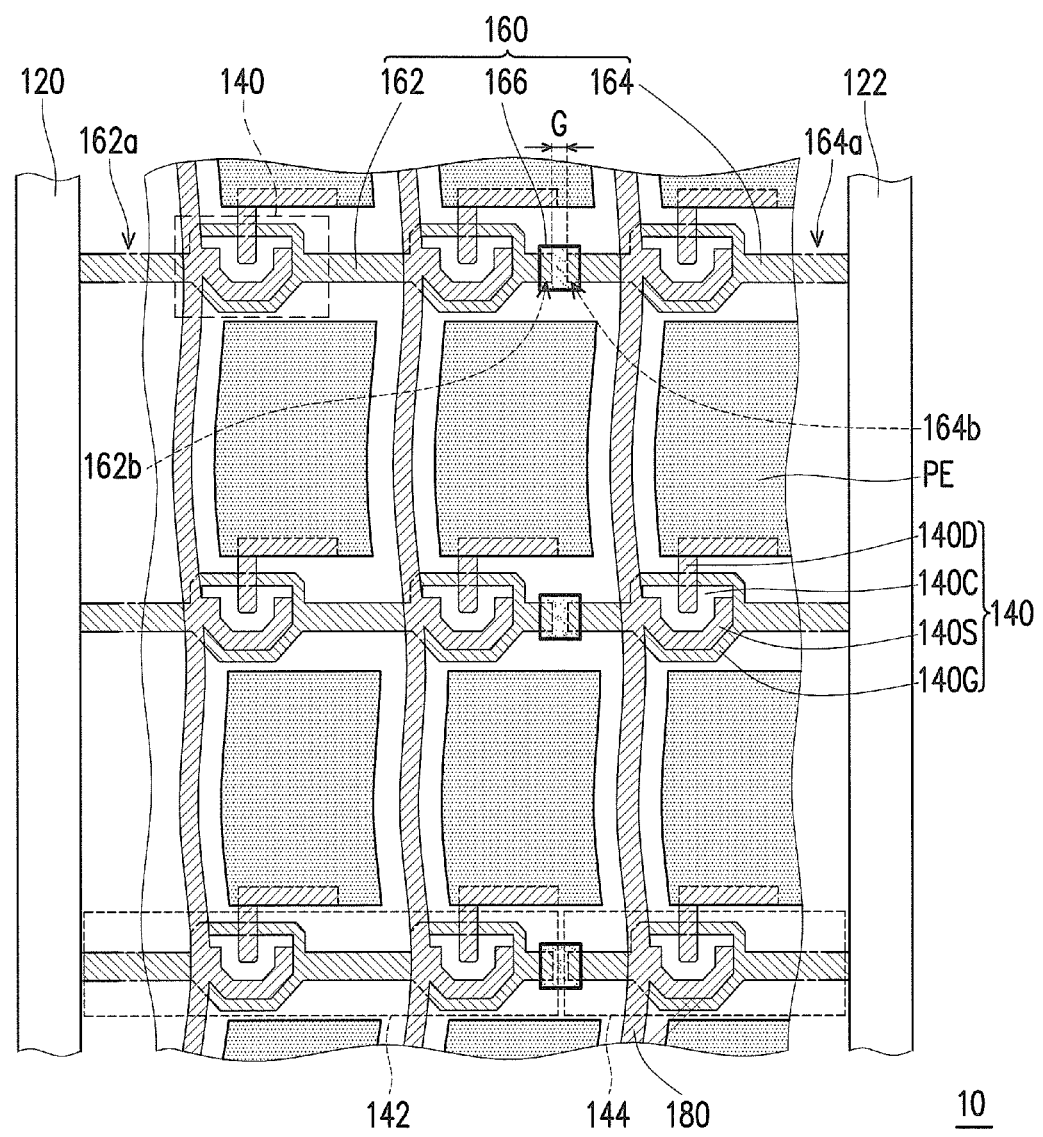
FIG. 2 illustrates a partial schematic diagram of the active device array substrate in FIG. 1.

FIG. 1 illustrates a schematic diagram of an active device array substrate according to an embodiment of the invention. FIG. 2 illustrates a partial schematic diagram of the active device array substrate in FIG. 1. Please refer to FIG. 1 and FIG. 2 simultaneously. In the embodiment, an active device array substrate 10 includes a substrate 100, a first gate driving circuit 120, a second gate driving circuit 122, active devices 140, scan line structures 160, and data lines 180. The substrate 100 has an active region 102, a first peripheral region 104, and a second peripheral region 106. The active region 102 is located between the first peripheral region 104 and the second peripheral region 106. The first gate driving circuit 120 is located at the first peripheral region 104. The second gate driving circuit 122 is located at the second peripheral region 106. The active devices 140 are arranged in an array at the active region 102. The data lines 180 are respectively connected to the active devices 140. It should be noted that, for the convenience of description, amounts of the scan line structures 160 and the data lines 180, and arrangement of the active devices 140 illustrated in FIG. 1 are for illustrative purpose only instead of limiting the invention. Moreover, repeated parts of the active devices 140 are also omitted, which only illustrate an array with 3×3 devices for the illustrative purpose.

FIG. 2 shows that, each active device 140 includes a gate 140G, a channel layer 140C, a source 140S and a drain 140D. The gate 140G is connected to the corresponding scan line structures 160 or substantially formed by a part of the corresponding scan line structure 160. The channel layer 140C is located above the gate 140G. The source 140S and the drain 140D which are structurally independent with each other contact the channel layer 140C, and the source 140S is connected to the data line 180. The active device 140 is illustrated as a bottom-gate thin film transistor in FIG. 2, but the invention is not limited thereto, stacking relationship of each of the above components may be adjusted so as to make the active device 140 to be a top-gate thin film transistor or thin film transistor of other forms. Besides, in order to apply to a display panel to drive display medium, pixel electrodes PE may be further included on the active device array substrate 10, and each pixel electrodes PE is connected to the corresponding active device 140. In other embodiments, the display medium may be driven by the drain 140D so that the pixel electrode PE may not need to be further disposed on the active device array substrate 10. Among the components in the active device 140, the gate 140G may be fabricated from the first conductive layer, the source 140S and the drain 140D may be fabricated from the second conductive layer, and the pixel electrode PE may be fabricated from the third conductive layer. "The first", "the second", and "the third" used herein are merely to express the three conductive layers are in different conductive layers, and are not intended to limit the stacking order of the conductive layers.

In the embodiment, each scan line structure 160 includes a first scan line 162, a second scan line 164, and an auxiliary pattern 166. The first scan line 162 is connected to a first part 142 of the active devices 140 in one row, and the first scan line 162 has a first connecting end 162a and a first terminal end 162b. The first connecting end 162a extends toward the first gate driving circuit 120. The second scan line 164 is connected to a second part 144 of the active devices 140 in the row, and the second scan line 164 has a second connecting end 164a and a second terminal end 164b. The second connecting end 164a extends toward the second gate driving circuit 122. A gap G is between the first terminal end 162b and the second terminal end 164b, wherein the first terminal end 162b and the second terminal end 164b are adjacent to each other. In addition, the auxiliary pattern 166 is disposed on the gap G, and the auxiliary pattern 166 at least overlaps the first terminal end 162b of the first scan line 162 and the second terminal end 164b of the second scan line 164. In the embodiment, the first gate driving circuit 120 and the second gate driving circuit 122 may further be respectively connected to the control panel 194 by wires (not shown) through a circuit board 192. The first scan line 162 of each of the scan line structures 160 is driven by the first gate driving circuit 120, and the second scan line 164 of each of the scan line structures 160 is driven by the second gate driving circuit 122. Specifically, a scanning time sequence of the first scan line 162 of each of the scan line structures 160 may be the same as a scanning time sequence of the second scan line 164 of the same scan line structure 160. That is, the first scan line 162 and the second scan line 164 of each scan line structure 160 are driven synchronously.

Location and size of the gap G shown in FIG. 2 are merely for the illustrative purpose, and are not to limit the invention. For example, all the gaps G which are spacings disposed between two adjacent active devices 140 are the embodiments of the invention, which is not reiterated herein. Furthermore, in the embodiment, a first part 142 of the active devices 140 of the same row means the active devices 140 which are located between the gap G and the first gate driving circuit 120, and a second part 144 of the active devices 140 of the same row means the active devices 140 which are located between the gap G and the second gate driving circuit 122.

Accordingly, in the active device array substrate 10 of the embodiment, the first scan line 162 and the second scan line 164 of the same scan line structure 160 are respectively connected to the first gate driving circuit 120 and the second gate driving circuit 122 which are disposed at two sides of the active region 102. At this time, the first gate driving circuit 120 provides at least sufficient driving capability, which allows all the active devices 140 on each of the first scan lines 162 to have good driving characteristics such as a capability to charge and discharge. Moreover, the second gate driving circuit 122 provides at least sufficient driving capability, which allows all the active devices 140 on each of the second scan line 164 to have good driving characteristics such as the capability to charge and discharge.

Furthermore, please refer to FIG. 1 again. In the embodiment, the active region 102 may be divided into a central region 102a and two outer regions 102b which are located at two sides of the central region 102a. Widths of the two outer regions 102b located at two sides of the central region 102a are respectively substantially greater than or equal to one third of an overall width of the active region 102. In the embodiment, the gaps G of the scan line structures 160 are distributed in the central region 102a. Therefore, a length of the first scan line 162 and a length of the second scan line 164 of each of the scan line structures 160 are respectively substantially greater than or equal to one third of the overall width of the active region 102. Additionally, in the embodiment, the gaps G of the scan line structures 160 are arranged along a straight line path S. Accordingly, the first scan lines 162 of the scan line structures 160 have the same length, and the second scan lines 164 of the scan line structures 160 have the same length, but the invention is not limited thereto.

When the gaps G of the scan line structures 160 are arranged along the straight line path S, and particularly, when the gaps G of the scan line structures 160 are distributed at a central position of the central region 102a, the length of the first scan lines 162 and the length of the second scan lines 164 of each of the scan line structures 160 can be substantially the same. Accordingly, differences of the RC delay phenomenon between the first scan line 162 and the second scan line 164 corresponding to the same row can be effectively reduced, which helps avoid the phenomenon of uneven brightness after forming the display panel.

The auxiliary pattern 166 is made of a conductive material, wherein the selected material thereof may be, for example, indium tin oxide, indium zinc oxide, aluminum tin oxide, aluminum zinc oxide, indium gallium Zinc oxide, or metal materials. In the embodiment, the first scan lines 162 and the second scan lines 164 of the scan line structures 160, which are the same as the gate 140G of the active devices 140, may be fabricated from the first conductive layer. The auxiliary pattern 166 may be selectively fabricated from the second conductive layer or the third conductive layer. That is, the auxiliary pattern 166 may be fabricated without disposition of additional conductive layers. Instead, the auxiliary pattern 166 may be fabricated from the existing material layers of the active devices 140, but the invention is not limited thereto. Since the auxiliary pattern 166 is made of the conductive material, it may serve as a component for repairing.

Figure 3:
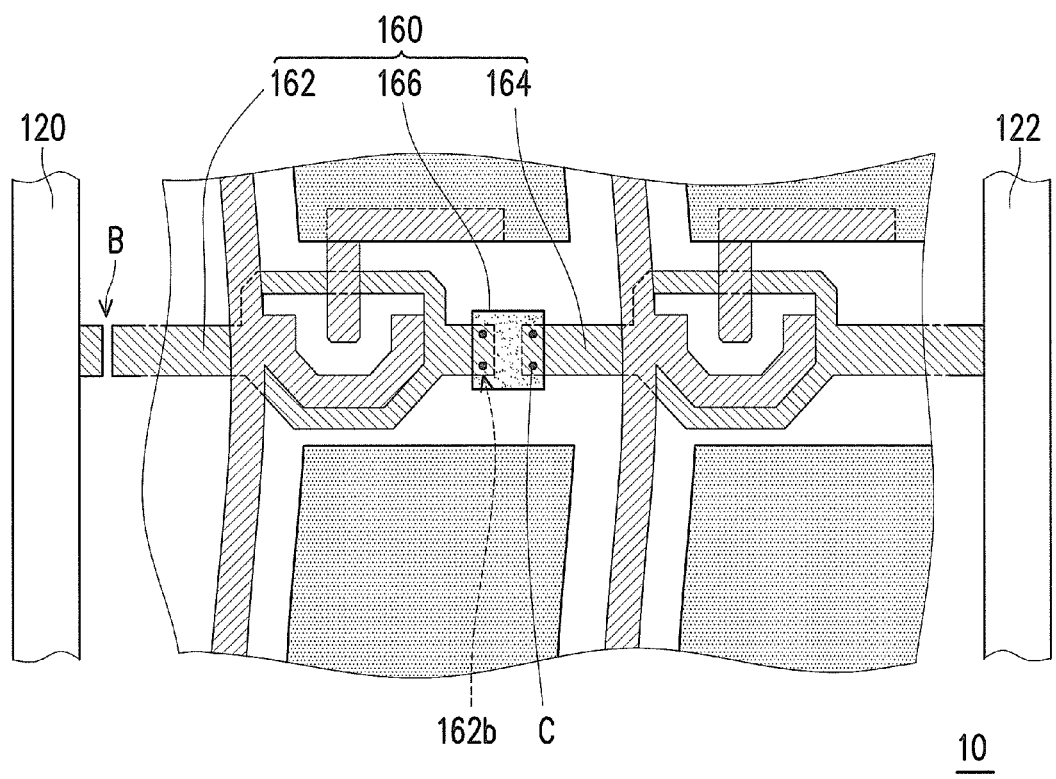
FIG. 3 illustrates a schematic diagram of a repairing method which is applicable to the active device array substrate in FIG. 1.

FIG. 3 illustrates a schematic diagram of a repairing method which is applicable to the active device array substrate in FIG. 1. Please refer to FIG. 1 and FIG. 3 simultaneously. When a line defect on the active device array substrate 10 occurs and the line defect corresponds to the first scan line 162 of one of the scan line structures 160, the corresponding first scan line 162 may be disconnected from the first gate driving circuit 120 at location B by laser cutting. In addition, the connecting conductors are formed in order to connect between the first terminal end 162b and the auxiliary pattern 166, and to connect between the second end 164b and the auxiliary pattern 166. The connecting conductors may be weld joints C formed by a welding method.

Accordingly, the first scan line 162 and the second scan line 164 of this scan line structure 160 may be similarly connected to the second gate driving circuit 122 and be similarly driven by the second gate driving circuit 122. Therefore, the first scan line 162 and the second scan line 164 of this scan line structure 160 may be normally operated and drive the active devices 140 on the corresponding row, so as to repair the line defect. Herein, although the first scan line 162 of one of the scan line structures 160 is exemplified as having defects, but the invention is not limited thereto. In other embodiments, when the second scan line 164 of one of the scan line structures 160 has defects, the repairing method may be disconnecting the second scan line 164 in the defected row from the second gate driving circuit 122, and forming the connecting conductor at the corresponding auxiliary pattern 166, such that the first scan line 162 and the second scan line 164 are conducted to each other. At this time, in the repaired scan line structure 160, the first scan line 162 and the second scan line 164 are both driven by the first gate driving circuit 120.

Accordingly, in the repaired scan line structure 160, the first scan line 162 and the second scan line 164 are conducted to each other and are both to be driven by the second gate driving circuit 122 or are both to be driven by the first gate driving circuit 120. Therefore, in the embodiment, the driving capabilities of the first gate driving circuit 120 and the second gate driving circuit 122 are designed to be sufficient to simultaneously drive all the active devices 140 on the first scan line 162 and the second scan line 164 which are conducted to each other. Accordingly, all the active devices 140 on each first scan lines 162 and each second scan lines 164 may have the good driving effects. Furthermore, in the scan line structures 160 which are not required to be repaired, the first scan line 162 and the second scan line 164 are respectively driven by the first gate driving circuit 120 and the second gate driving circuit 122. Therefore, as compared to the loading of a single driving circuit which simultaneously drives the first scan line 162 and the second scan line 164, the loading such as a resistance-capacitance loading subjected by the first gate driving circuit 120 and the second gate driving circuit 122 is reduced. Therefore, the structures of the embodiment not only may be repairable, but also may save electric energy.

Figure 4A:
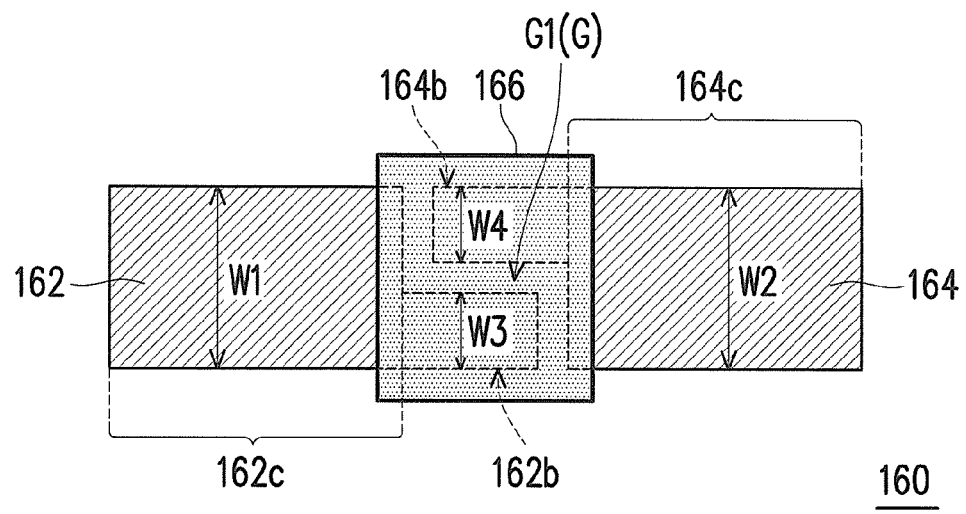
FIG. 4A illustrates a partial schematic diagram of the scan line structures of the active device array substrate in FIG. 2 according to an embodiment.
Figure 4B:
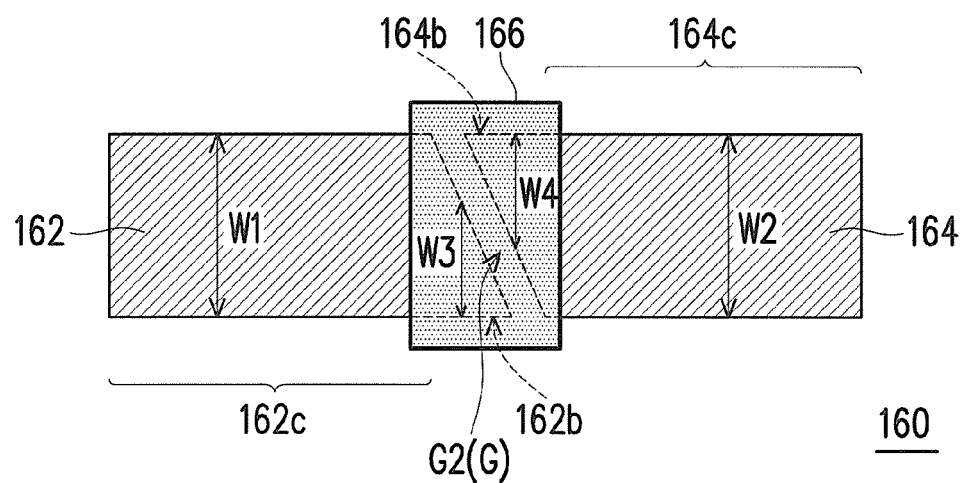
FIG. 4B illustrates a partial schematic diagram of the scan line structures of the active device array substrate in FIG. 2 according to another embodiment.

Furthermore, FIG. 4A illustrates a partial schematic diagram of the scan line structures of the active device array substrate in FIG. 2 according to an embodiment. Please refer to FIG. 2 and FIG. 4A simultaneously. In the embodiment, the first scan line 162 of each of the scan line structures 160 has a first main line portion 162c, and the second scan line 164 of each of the scan line structures 160 has a second main line portion 164c. A linewidth W1 of the first main line portion 162c is greater than a linewidth W3 of the first terminal end 162b. A linewidth W2 of the second main line portion 164c is greater than a linewidth W4 of the second end 164b. The first terminal end 162b extends from the first main line portion 162c toward the second main line portion 164c. The second terminal end 164b extends form the second main line portion 164c toward the first main line portion 162c. At this time, the gap G1 is zigzag-shaped. Or, FIG. 4B illustrates a partial schematic diagram of the scan line structures of the active device array substrate in FIG. 2 according to another embodiment. Please refer to FIG. 2 and FIG. 4B simultaneously. In the embodiment, the first scan line 162 of each of the scan line structures 160 has a first main line portion 162c, and the second scan line 164 of each of the scan line structures 160 has a second main line portion 164c. The linewidth W1 of the first main line portion 162c is greater than the linewidth W3 of the first terminal end 162b. The linewidth W2 of the second main line portion 164c is greater than the linewidth W4 of the second end 164b. The first terminal end 162b extends from the first main line portion 162c toward the second main line portion 164c. The second terminal end 164b extends form the second main line portion 164c toward the first main line portion 162c. At this time, the gap G1 is slash-shaped.

Figure 5:
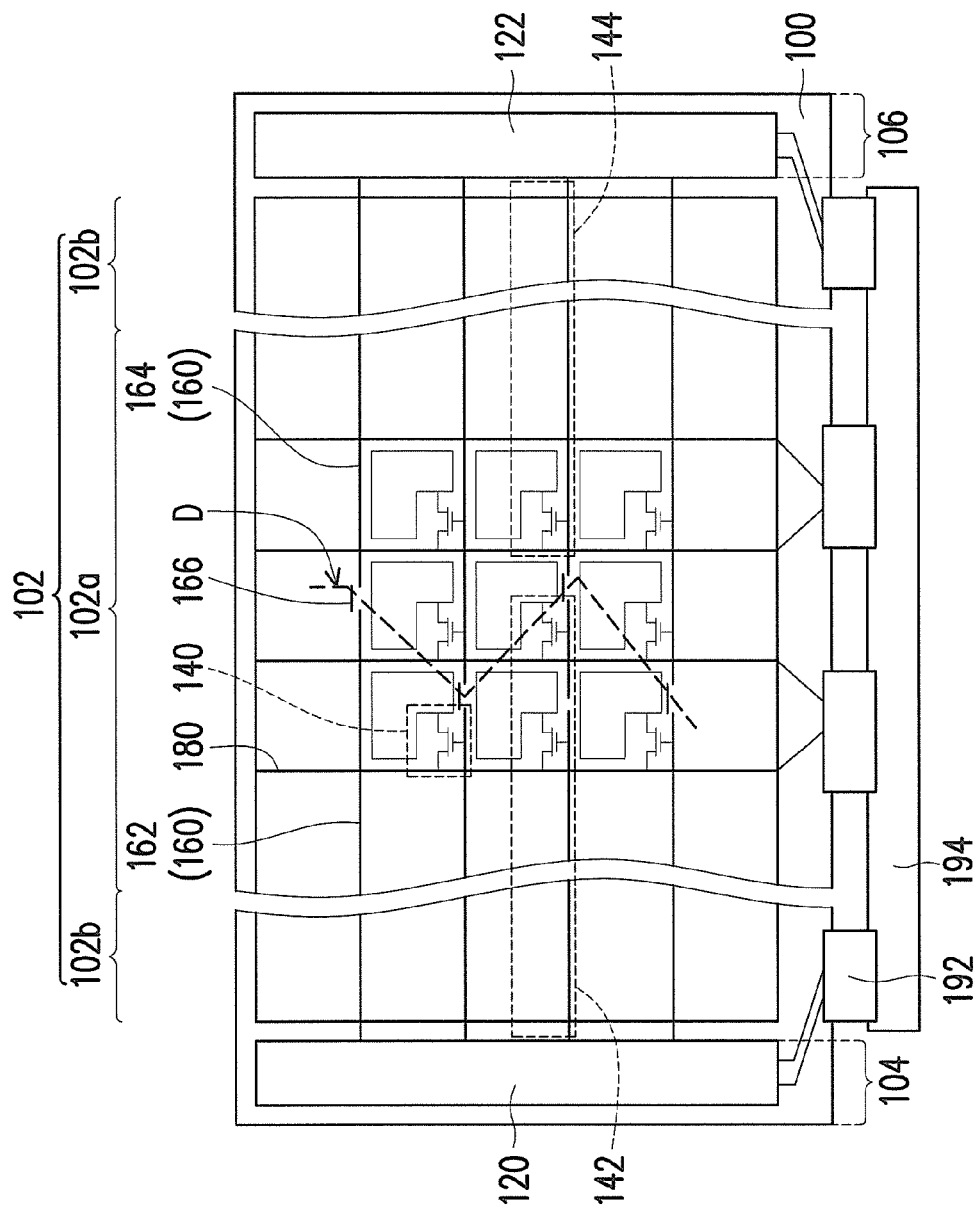
FIG. 5 illustrates a schematic diagram of an active device array substrate according to another embodiment of the invention.

FIG. 5 illustrates a schematic diagram of an active device array substrate according to another embodiment of the invention. Please refer to FIG. 5. In the embodiment, an active device array substrate 20 is similar to the active device array substrate 10, wherein the similar components are represented by the identical reference numerals. The similar components have the similar functions, wherein the descriptions are omitted. The main difference between the active device array substrate 20 and the active device array substrate 10 is that, the gaps G of the scan line structures 160 are arranged along a zigzag line path D, instead of being arranged along the straight line path.

Figure 6:
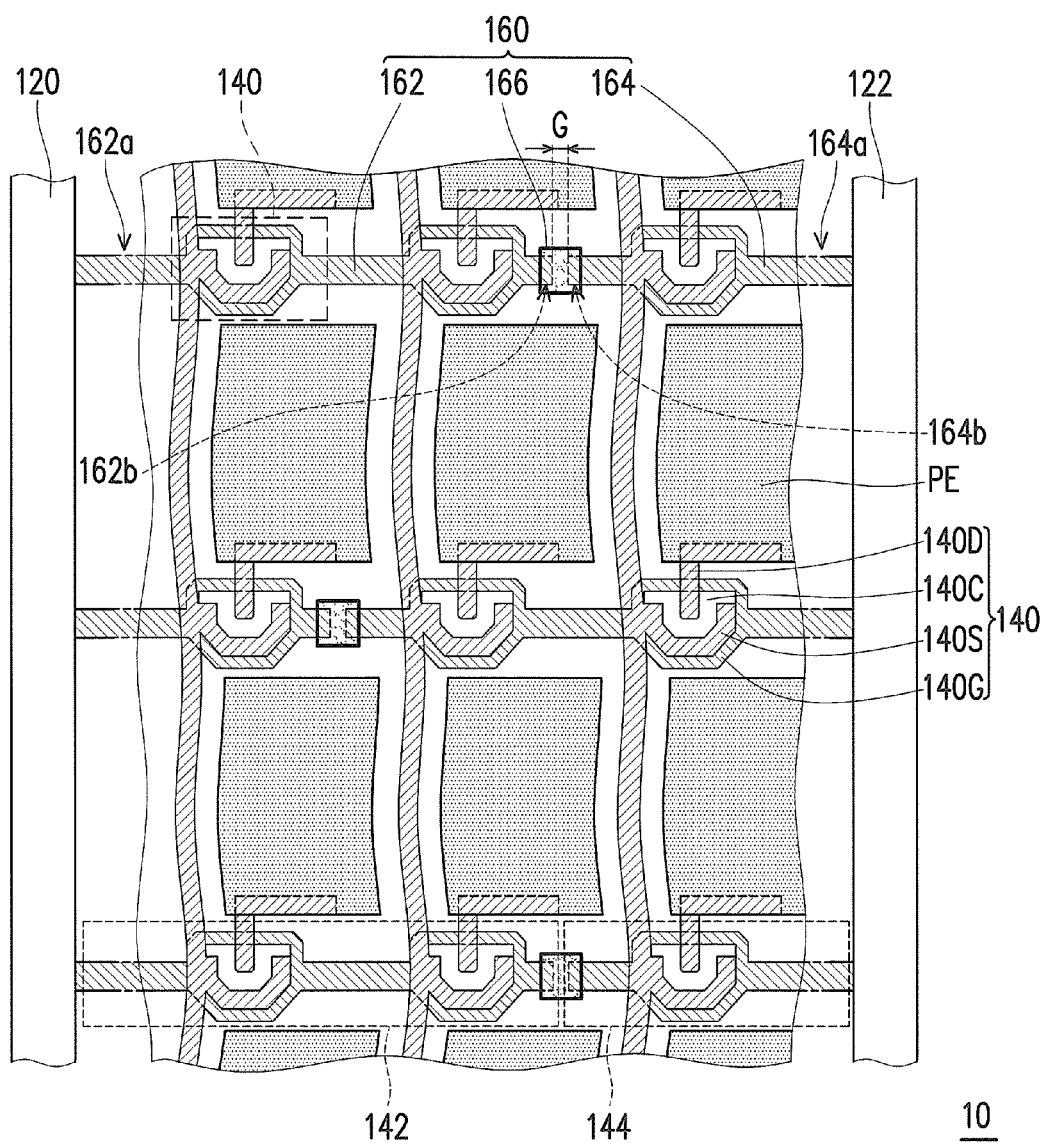
FIG. 6 illustrates a partial schematic diagram of the active device array substrate in FIG. 5.

FIG. 6 illustrates a partial schematic diagram of the active device array substrate in FIG. 5. Please refer to FIG. 5 and FIG. 6 simultaneously. In the embodiment, each scan line structure 160 includes the first scan line 162, the second scan line 164, and the auxiliary pattern 166. The first scan line 162 is connected to the first part 142 of the active devices 140 in one row, and the first scan line 162 has the first connecting end 162a and the first terminal end 162b. The first connecting end 162a extends toward the first gate driving circuit 120. The second scan line 164 is connected to the second part 144 of the active devices 140 in the row, and the second scan line 164 has the second connecting end 164a and the second terminal end 164b. The second connecting end 164a extends toward the second gate driving circuit 122. The gap G is between the first terminal end 162b and the second end 164b, wherein the first terminal end 162b and the second end 164b are adjacent to each other. The positions of the gaps G in the active devices shown in FIG. 5 are merely for the illustrative purposes, instead of limiting the invention.

Accordingly, in the active device array substrate 20 of the embodiment, the first scan line 162 and the second scan line 164 of the scan line structure 160 are respectively connected to the first gate driving circuit 120 and the second gate driving circuit 122 which are disposed at two sides of the active region 102. In other words, the first gate driving circuit 120 provides at least sufficient driving capability, which allows all the active devices 140 on each of the first scan lines 162 to have good driving characteristics such as the capability to charge and discharge. Moreover, the second gate driving circuit 122 provides at least sufficient driving capability, which allows all the active devices 140 on each second scan line 164 to have good driving characteristics such as the capability to charge and discharge.

Furthermore, please refer to FIG. 5 again. In the embodiment, the active region 102 may be divided into the central region 102a and the two outer regions 102b which are located at two sides of the central region 102a. The gaps G of the scan line structures 160 are distributed in the central region 102a. In other words, the widths of the two outer regions 102b located at two sides of the central region 102a are substantially greater than or equal to one third of the overall width of the active region 102. In the embodiment, the gaps G of the scan line structures 160 are distributed in the central region 102a. Therefore, the length of the first scan line 162 and the length of the second scan line 164 of each of the scan line structures 160 are each substantially greater than or equal to one third of the overall width of the active region 102. Furthermore, in the embodiment, the gaps G of the scan line structures 160 are arranged along the zigzag line path D. Accordingly, the first scan lines 162 of the scan line structures 160 have at least two lengths, and the second scan lines 164 of the scan line structures 160 have at least two lengths. Thereby, differences of the RC delay phenomenon between the scan line structures 160 corresponding to different rows can be effectively reduced, which helps avoid the phenomenon of uneven brightness after forming the display panel.

Apart from the above, the partial schematic diagram of the scan line structures of the active device array substrate 20 in the embodiment and the partial schematic diagram of the scan line structures of the active device array substrate 10 may be the same. The shape changes of the gaps G may refer to FIG. 4A and FIG. 4B, which is not reiterated herein. Moreover, the repairing method which is applicable to the active device array substrate 20 in FIG. 5 may be the same as the repairing method which is applicable to the active device array substrate 10 in FIG. 1. Please refer to FIG. 3, the repairing method applicable to the active device array substrate 20 is not reiterated herein.

According to the above, the scan lines of the active device array substrate in the invention are driven by the first gate driving circuit and the second gate driving circuit which are disposed at two sides of the active region. The first gate driving circuit and the second gate driving circuit are respectively connected to the first connecting end of the first scan line and the second connecting end of the second scan line of the active devices which are in the same row. Moreover, the gap is between the first terminal end of the first scan line and the second terminal end of the second scan line. Accordingly, the large current produced due to the large voltage difference at two ends of the same scan line, which damages the control board providing signals, can be effectively avoided. In addition, the auxiliary pattern is disposed on and overlaps the gap between the first terminal end of the first scan line and the second terminal end of the second scan line, and the scanning time sequence of the first scan line may be the same as the scanning time sequence of the second scan line. Thereby, when the line defect of the first scan line in one of the scan line structures on the active device array substrate is occurred, the first scan line with the line defect may be disconnected from the first gate driving circuit by the laser cutting. Additionally, the first terminal end of the first scan line with the line defect is connected to the auxiliary pattern by the welding method, and similarly, the second terminal end of the second scan line in the same row is connected to the auxiliary pattern by the welding method. Thereby, both the first scan line with the line defect and the second scan line in the same row can be driven by the second gate driving circuit. Accordingly, the panel with the defect can be effectively repaired, which avoids the increased production cost caused by discarding the defected panel. Certainly, the above repairing method can also be used to repair the second scan line with the line defect.

It will be apparent to those skilled in the art that various modifications and variations can be made to the structure of the disclosed embodiments without departing from the scope or spirit of the invention. In view of the foregoing, it is intended that the disclosure cover modifications and variations of this specification provided they fall within the scope of the following claims and their equivalents.

What is claimed is:

1. An active device array substrate, comprising:
   a substrate, having an active region, a first peripheral region, and a second peripheral region, wherein the active region is located between the first peripheral region and the second peripheral region;
   a first gate driving circuit, located at the first peripheral region;
   a second gate driving circuit, located at the second peripheral region;
   a plurality of active devices, arranged in an array at the active region;
   a plurality of scan line structures, each of the scan line structures comprising:
      a first scan line, connected to a first part of the active devices arranged in one row and having a first connecting end and a first terminal end, the first connecting end extending toward the first gate driving circuit;
      a second scan line, connected to a second part of the active devices in the row and having a second connecting end and a second terminal end, the second connecting end extending toward the second gate driving circuit, wherein a gap is between the first terminal end and the second terminal end; and
      an auxiliary pattern, disposed on the gap and overlapping the first terminal end and the second terminal end; and
   a plurality of data lines, respectively connected to the active devices.

2. The active device array substrate as claimed in claim 1, wherein the active region is divided into a central region and two outer regions which are located at two sides of the central region, and the gaps of the scan line structures are distributed in the central region.

3. The active device array substrate as claimed in claim 2, wherein widths of the two outer regions are respectively substantially greater than or equal to one third of an overall width of the active region.

4. The active device array substrate as claimed in claim 1, wherein a length of the first scan line and a length of the second scan line of each of the scan line structures are respectively substantially greater than or equal to one third of the overall width of the active region.

5. The active device array substrate as claimed in claim 1, wherein a scanning time sequence of the first scan line of each of the scan line structures is the same as a scanning time sequence of the second scan line of the scan line structure.

6. The active device array substrate as claimed in claim 1, wherein the first scan line of each of the scan line structures is driven by the first gate driving circuit, and the second scan line of each of the scan line structures is driven by the second gate driving circuit.

7. The active device array substrate as claimed in claim 1, wherein the first scan line of at least one of the scan line structures is disconnected from the first gate driving circuit, and the at least one scan line structure further comprises connecting conductors, wherein the connecting conductors are connected between the first terminal end and the auxiliary pattern and connected between the second terminal end and the auxiliary pattern.

8. The active device array substrate as claimed in claim 7, wherein the connecting conductors comprise weld joints.

9. The active device array substrate as claimed in claim 7, wherein the first scan line and the second scan line of the at least one scan line structure are both driven by the second gate driving circuit.

10. The active device array substrate as claimed in claim 1, wherein the first scan line of each of the scan line structures has a first main line portion and the second scan line of each of the scan line structures has a second main line portion, a linewidth of the first main line portion is greater than a linewidth of the first terminal end, a linewidth of the second main line portion is greater than a linewidth of the second terminal end, and the first terminal end extends from the first main line portion toward the second main line portion, and the second terminal end extends from the second main line portion toward the first main line portion.

11. The active device array substrate as claimed in claim 1, wherein the gaps of the scan line structures are arranged along a straight line path.

12. The active device array substrate as claimed in claim 11, wherein the first scan lines of the scan line structures have the same length, and the second scan lines of the scan line structures have the same length.

13. The active device array substrate as claimed in claim 1, wherein the gaps of the scan line structures are arranged along a zigzag line path.

14. The active device array substrate as claimed in claim 13, wherein the first scan lines of the scan line structures have at least two lengths, and the second scan lines of the scan line structures have at least two lengths.

15. A repairing method, comprising:
   providing an active device array substrate, wherein the active device array substrate comprises:
      a substrate, having an active region, a first peripheral region, and a second peripheral region, wherein the active region is located between the first peripheral region and the second peripheral region;

a first gate driving circuit, located at the first peripheral region;

a second gate driving circuit, located at the second peripheral region;

a plurality of active devices, arranged in an array at the active region;

a plurality of scan line structures, wherein each of the scan line structures comprises:

a first scan line, connected to a first part of the active devices in one row and having a first connecting end and a first terminal end, the first connecting end extending toward the first gate driving circuit;

a second scan line, connected to a second part of the active devices in the row and having a second connecting end and a second terminal end, the second connecting end extending toward the second gate driving circuit, wherein a gap is between the first terminal end and the second terminal end; and an auxiliary pattern, disposed on the gap and overlapping the first terminal end and the second terminal end; and data lines, respectively connected to the active devices; and when a line defect on the active device array substrate occurs and the line defect corresponds to the first scan line of one of the scan line structures, disconnecting the first scan line from the first gate driving circuit, and forming connecting conductors which connect between the first terminal end and the auxiliary pattern and connect between the second terminal end and the auxiliary pattern.

16. The repairing method as claimed in claim 15, wherein a method of forming the connecting conductors comprises a welding method.

17. The repairing method as claimed in claim 15, wherein a method of disconnecting the first scan line from the first gate driving circuit comprises laser cutting.

\* \* \* \* \*